July 3, 1962 C. M. CAMPBELL, JR 3,042,814

NON-SATURATING TRANSISTOR FLIP-FLOP UTILIZING
INDUCTANCE MEANS FOR SWITCHING

Filed June 27, 1960

INVENTOR.
CARL M. CAMPBELL, JR.
BY Frank H. Cullen
ATTORNEY 3,042,814

NON-SATURATING TRANSISTOR FLIP-FLOP UTILIZING INDUCTANCE MEANS FOR SWITCHING

Carl M. Campbell, Jr., Broomall, Pa., assignor to Burroughs Corporation, Detroit, Mich., a corporation of Michigan Filed June 27, 1960, Ser. No. 38,868
8 Claims. (Cl. 307—88.5)

Figure 1:
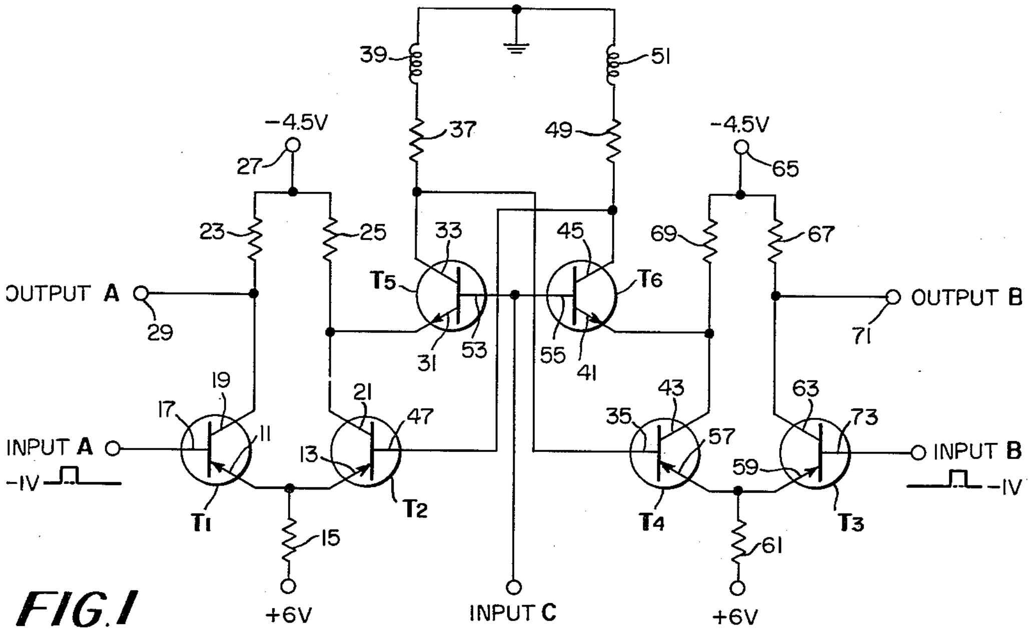

This invention relates to bistable circuits and more specifically to a bistable circuit utilizing transistors. The circuit is commonly known as a flip-flop.

A flip-flop is an electronic device having two stable states and requiring a trigger pulse or signal to provide an abrupt change from the first stable state to the second stable state. Various output signals may be derived from the circuit. The utilization of transistors in the invention achieves reliability, compactness, low power dissipation, high efficiency, low power requirements, and good mechanical rigidity.

A bistable circuit finds use in a number of situations where various signals are required, particularly in the computer art. In the circuit of the present invention, the simplicity with which various outputs and frequencies can be obtained makes it very flexible. The bistable circuit of the present invention operates in two distinct states or modes: a first state or mode wherein certain of the transistors are conducting and produce an output, and a second mode where other of the transistors are conducting and produce a second output. The outputs may be of the same or different characteristics.

The present invention is a non-saturating device which allows improved switching time of the circuit. Many prior art circuits operated in a manner such that saturation of one or more of the transistors occurred and hence the carrier storage time associated with a saturated transistor must be added to the time required for the circuit to change from one stable state or mode to the other. Further, the circuit is so designed that the outputs are isolated from the internal flip-flop and the flip-flop is rendered insensitive to trigger amplitude above a certain minimum voltage. Also, drift transistors may be readily utilized in this circuit.

The circuit may be either non-complementing or complementing. A non-complementing flip-flop has two input terminals and will change its state when input pulses are applied to first one and then the other of these terminals. If two input pulses are applied successively to the same input terminal, the flip-flop will remain in the same state, e.g., it will not switch to its other stable state.

On the other hand, a complementing flip-flop requires but a single input terminal and, in response to a properly applied pulse, will change to its other state regardless of which one of its two states it was in at the time of the application of the input pulse.

The invention utilizes an LR (inductance-resistance) type of coupling which presents a number of advantages over the RC (resistance-capacitance) coupling of prior art circuits. In the LR coupling of the present invention, fewer components are necessary than in the RC type of coupling thus improving the reliability. Further, when utilizing the grounded base configuration of the LR coupling, the transient response of the NPN coupling transistors is remarkably improved.

It is an object of the invention to improve the switching time of a transistor flip-flop.

It is another object of the invention to improve the operation of complementing and non-complementing flip-flops.

It is another object of the invention to isolate the output circuitry from the internal flip-flop and thereby eliminate load effects on switching time.

It is still another object of the invention to provide a transistor flip-flop having high output current and low output impedance, thus enabling the circuit to drive other gates and flip-flops through long distances with minimum stray capacitance effects.

It is a further object of the invention to improve the switching time of a non-saturating transistor flip-flop utilizing inductance means for switching.

These and other objects of the invention are achieved by the transistor flip-flop circuit which includes two transistors connected in a recipro-conductive fashion, each of which utilizes a cross-coupling transistor or cross-over transistor which serves the dual purpose of altering the bias of the flip-flop transistors and also providing the proper current switching to achieve positive cut-off and turn-on of the main flip-flop transistors. An auxiliary transistor is connected in a common emitter configuration with each of the flip-flop transistors to enable the modes to be isolated from the internal flip-flop.

The recipro-conductive action is achieved by having the signal turn a conducting transistor "off." This action, in turn, causes the necessary alteration of the bias and current switching of other transistors to effect the change in current conduction. The circuit of the invention is a stable flip-flop, that is, it must be triggered from one state to the other. It may be operated in either a complementing or a non-complementing arrangement.

Figure 2:
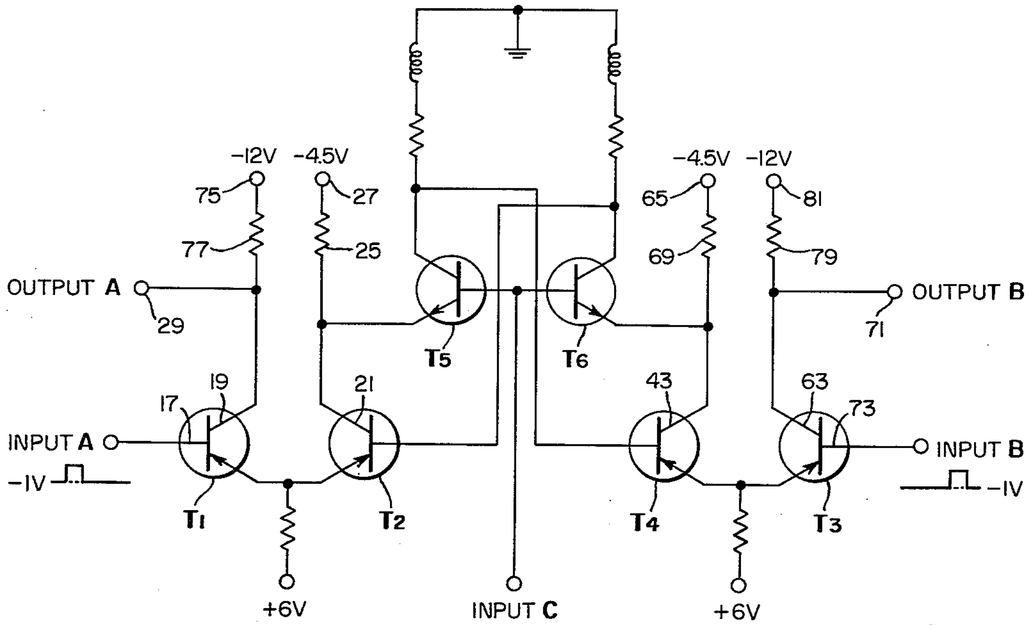

While the foregoing is a summary, the invention will be best understood from a detailed description of a tested embodiment taken together with the drawing wherein:

FIGURE 1 is a schematic of the transistor flip-flop circuit embodied in the present invention; and FIGURE 2 is a modification of FIGURE 1 which can be utilized to obtain a larger voltage output.

Referring now to FIGURE 1, there is shown an embodiment of the invention which is utilized when a relatively small output voltage or signal is desired. Transistors $T_1$, $T_2$, $T_3$ and $T_4$ are of the PNP type. Transistors $T_5$ and $T_6$ are of the opposite type or NPN's. It is to be understood that transistors $T_1$, $T_2$, $T_3$ and $T_4$ may be NPN type and transistors $T_5$ and $T_6$ of the PNP type and that in any case the transistors have at least two main current carrying electrodes and a control electrode. With these changes in the conductivity type of transistors, the polarity of the power sources would be reversed.

$T_1$ and $T_2$ have their emitters 11 and 13 coupled together and to a source of positive potential through a resistor 15. An input signal, when the bistable circuit is used as a non-complementing flip-flop, is applied to the terminal Aw hich is coupled to the base 17 of $T_1$. The collector 19 of $T_1$ and the collector 21 of $T_2$ are coupled respectively through the resistors 23 and 25 to a source of negative potential 27. The first Output A is derived at the terminal 29 from the collector 19 of $T_1$.

The emitter 31 of $T_5$ is coupled to the collector 21 of $T_2$ and the resistor 25. The collector 33 of $T_5$ is coupled to the base 35 of $T_4$ and to ground through the resistor 37 and the inductor 39.

The emitter 41 of $T_6$ is coupled to the collector 43 of $T_4$. The collector 45 of $T_6$ is connected to the base 47 of $T_2$ as well as to ground through the resistor 49 and the inductor 51. The base 53 of $T_5$ and the base 55 of $T_6$ are coupled to the Input C. The Input C is utilized as the input to switch the flip-flop when it is operated as a complementing bistable circuit.

The emitter 57 of $T_4$ and the emitter 59 of $T_3$ are coupled to a source of positive potential through the resistor 61. The collector 63 of $T_3$ is coupled to a source of negative potential at the terminal 65 through the resistor 67. Also coupled to the terminal 65 is the collector 43 of $T_4$ through the resistor 69. The other output is derived at the terminal 71 which is coupled to the collector 63 of $T_3$. This other output will be designated as Output B. The other input, when operating the circuit in the non-complementing manner, is to the base 73 of $T_3$ and will be designated as Input B.

In FIGURE 2, a similar circuit is shown which is utilized when a larger output pulse is desired. Similar reference numerals are used for similar elements and the differences in FIGURE 1 and FIGURE 2 comprise larger value resistors in the collector circuits of $T_1$ and $T_3$ and the application of different voltages to these resistors. In FIGURE 2, the collector 19 of $T_1$ is coupled to the Output A, or the terminal 29, and to a resistor 77 of larger ohmic value than the resistor 23 of FIGURE 1. The other terminal of the resistor 77 is connected to a larger source of potential at the terminal 75 than is applied at terminal 27.

Similarly, the collector 63 of $T_3$ is now coupled to a greater source of negative potential at the terminal 81 through the resistor 79, which is of larger ohmic value than the resistor used in previous circuit. The Output B remains at 71 and is coupled to the collector 63 of $T_3$ and to the resistor 79.

When operating the circuit in the non-complementing manner, alternate inputs of similar polarity are applied at Input A and Input B. When operating the circuit in the complementing manner, the input is to the bases 53 and 55 over the Input C. Outputs are derived at the terminal 29 and the terminal 71 in either manner of operation.

The operation of the circuit of FIGURE 1 will be explained first by utilizing the complementing method. To operate the circuit in this manner, pulses are applied at only the Input C which is coupled to the base 53 and the base 55 of the cross-coupling of interconnected transistors $T_5$ and $T_6$. In the specific embodiment shown in FIGURE 1, negative pulses are required at Input C. During the complementing method of operation, the base 17 of $T_1$ and the base 73 of $T_3$ are biased at —1.0 volt.

In the first state or mode, $T_1$, $T_4$ and $T_5$ are conducting and $T_2$, $T_3$ and $T_6$ are non-conducting or "off." When the circuit switches, an output signal or pulse appears at Output B and in this second state, $T_2$, $T_3$ and $T_6$ are conducting and $T_1$, $T_4$ and $T_5$ are "off." When the circuit switches back to its first state, an output signal or pulse appears at Output A. It is to be understood that, in the absence of an output pulse, the output terminals are at approximately —4.5 v.

For the purposes of explanation, we will assume that the flip-flop is in its first state and that $T_1$, $T_4$ and $T_5$ are conducting so that $T_2$, $T_3$ and $T_6$ are "off." It will be noted that the PNP transistor $T_1$ has its emitter 11 at a positive potential with respect to its base 17, he base being at less than ground potential. In other words, $T_1$ is forward biased in the base-emitter circuit. Similarly, $T_1$ is reverse biased in the collector-base circuit by having the collector 19 negative with respect to the base 17. This induces a state of conduction, so that as mentioned earlier, $T_1$ is in its conducting state.

$T_2$ is not conducting because a sufficient potential difference does not exist between its base 47 and its emitter 13. $T_4$ is conducting for the reason that, with the voltages shown, the emitter 57 and base 35 are in a forward biased condition while the collector 43 and base 35 are in a back or reversed biasing condition. Since the voltage on the emitter 57 of $T_4$ tends to follow the voltage on the base 35 while conducting, $T_3$ is "off" since there is not sufficient bias between the emitter 59 and the base 73 to place $T_3$ in a state of conduction.

The NPN transistor $T_5$ conducts while the flip-flop is in the first state since, with the voltages shown, the emitter 31 and the base 53 are forward biased and the collector 33 and the base 53 are back or reversed biased.

$T_6$ is not conducting because sufficient bias does not exist in the emitter 41 and base 55 circuit to produce conduction. This is true since the emitter 41 of $T_6$ is coupled to the conducting collector 43 of $T_4$, which tends to drive the negative potental at emitter 41 toward zero thus reducing the forward bias.

It can be seen that when $T_1$ is non-conducting, Output A is at approximately —4.5 v. Similarly, when $T_3$ is non-conducting, Output B is at approximately —4.5 v. If we desire a signal at Output B, i.e., a departure from the approximate 4.5 v. level, a negative pulse is applied at Input C. We will turn "off" $T_1$, $T_4$ and $T_5$ and turn "on" $T_2$, $T_3$ and $T_6$ so that an output will be produced at the Output B or the terminal 71. The negative pulse applied to Input C will insure that both $T_5$ and $T_6$ are "off" for the pulse duration. It is necessary that $T_5$ and $T_6$ be "off" during this time to permit proper switching of the transistors. The normal conducting path of $T_5$ is from the terminal 27, through the resistor 25, the emitter 31, the collector 33, the resistor 37, the inductor 39 and to ground. When $T_5$ is driven off by the input pulse, the current path is interrupted. Similarly, the current path of $T_6$ comprises the terminal 65, the resistor 69, the emitter 41, the collector 45, the resistor 49, the inductor 51 and to ground.

When $T_5$ turns "off" due to the negative pulse on the base 53 which decreases the forward bias on the emitter 31 and base 53 circuit, the inductor 39 supplies reverse current to $T_4$, since the current cannot change instantaneously in an inductance. This current flow through the inductance 39 and the resistor 37 will make the base 35 of $T_4$ positive enough with respect to its emitter 57 that $T_4$ turns "off." This, in turn, will cause the voltage to rise on the emitter 59 of $T_3$ which sufficiently forward biases $T_3$ to place that transistor $T_3$ in a state of conduction. Turing $T_3$ "on," gives an output at Output B, i.e., a change from the approximately 4.5 v. level. The base 73, during operation in the complementing method, is at a negative one volt as well as the base 17 of $T_1$.

When $T_4$ is "off," $T_6$ is now able to conduct, assuming the trigger or input has disappeared, due to the forward biasing which now appears. When $T_6$ starts to draw current, the drop in the inductor 51 and the resistor 49 causes the base 47 of $T_2$ to become more negative than minus one volt, thus causing $T_2$ to conduct and $T_1$ to turn "off." When $T_2$ is "on," $T_5$ is prevented from conducting since sufficient forward bias does not exist between its emitter 31 and its base 53 because of the direct connection between the collector 21 of $T_2$ and the emitter 31 of $T_5$.

Thus the state of the flip-flop has been changed from the first state or mode to its second state or mode and has produced an output at Output B. The characteristics of the outputs are, of course, dependent upon circuit parameters but they are of high current and voltage. The circuit will change its state for every negative pulse applied at Input C and since the input is insensitive to trigger amplitude above a minimum voltage, positive and reliable switching is achieved. The components are so chosen and the circuit is so designed that saturation does not occur, thus allowing quick recovery and permitting fast switching. The circuit of FIGURE 1 is now in its second state and a negative pulse will be applied to Input C to switch the circuit to its first state and thereby derive a signal at Output A, or perhaps more accurately, as noted earlier, a signal which rises from approximately —4.5 v.

With the application of a negative pulse to Input C, $T_6$ turns "off" because of loss of sufficient forward bias between its emitter 41 and the base 55. When $T_6$ turns "off," the inductance 51 supplies reverse current to the base of $T_2$ since current cannot change instantaneously in an inductance, as noted earlier. This current flow through the inductance 51 and the resistor 49 will make the base of $T_2$ positive enough with respect to its emitter 13 to cut $T_2$ "off" and turn $T_1$ "on." A signal now appears at the terminal 29 or Output A. When $T_2$ is "off," $T_5$ is able to conduct again, after the input pulse disappears, because of the restoration of forward bias. When $T_6$ is turned "off" by the ngeative pulse, $T_4$ has enough bias to conduct and the emitter 41 of $T_6$ is dropped below the value of forward bias needed for current flow. Thus the state has been changed from the second state back to the first state and $T_1$, $T_4$ and $T_5$ are now conducting and $T_2$, $T_3$ and $T_6$ are non-conducting. Signals have appeared at the respective output terminals at the appropriate times.

The operation of the circuit will now be described when one wishes to operate in the non-complementing manner. This method of operation involves the alternate application of switching or trigger pulses to Input A and Input B. If a switching pulse has been applied to Input A and the circuit has switched to its new state, the application of further pulses to Input A has no effect. It is necessary to apply a pulse to Input B if one wishes to cause the flip-flop to change state and produce an output signal, i.e., a departure from the quiescent level of approximately −4.5 v.

In the particular embodiment shown, positive going pulses, pulses which in the particular application rise from a negative value toward positive, are required at the inputs. Input C is held at reference potential.

Considering a similar case as discussed previously, $T_1$, $T_4$ and $T_5$ are conducting and $T_2$, $T_3$ and $T_6$ are non-conducting. A positive pulse at Input A causes $T_1$ to assume a state of non-conduction since the forward bias of the emitter 11 and the base 17 circuit has been reduced. $T_2$ will immediately start to conduct as the voltage on its emitter 13 has risen and the voltage on its base 47 is at substantially ground potential since $T_6$ is not conducting. When $T_2$ conducts, $T_5$ is caused to assume a state of non-conduction since the forward bias of its emitter 31 and base 53 circuit has been reduced. Current continues through the inductor 39 and the resistor 37 as reverse base current of $T_4$. This drives the base 35 of $T_4$ sufficiently positive to turn $T_4$ "off" and, due to the forward bias now available on the emitter 59 and base 73, circuit of $T_3$, $T_3$ conducts. $T_6$ will now conduct due to the return of the bias on its emitter 41 since $T_4$ is now non-conducting. The conduction of $T_6$ causes $T_2$ to remain conductive after the pulse leaves Input A.

The state of the circuit has been changed and a signal pulse has been generated at Output B since the "on" transistors have been turned "off" and the "off" transistors have been turned "on" ($T_2$, $T_3$ and $T_6$ are "on" while $T_1$, $T_4$ and $T_5$ are "off"). Further positive pulses at Input A will have no effect until a positive pulse has been applied at Input B.

With the application of a positive pulse to Input B, the operation is similar to that when a positive pulse is applied to the Input A. With the application of the pulse to Input B, $T_3$ is rendered non-conducting and $T_4$ commences conduction. With $T_4$ conducting, its collector voltage changes, thus cutting "off" $T_6$. With $T_6$ "off," $T_2$ cuts off due to the base 47 and collector 45 connection. With $T_2$ off, $T_1$ and $T_5$ commence conduction because of the favorable biases now available.

The flip-flop has produced a signal at Output A and has returned to its first state with $T_1$, $T_4$ and $T_5$ conducting.

The operation of the circuit as disclosed in FIGURE 2 is similar to that disclosed in FIGURE 1. This circuit is utilized when a larger output voltage at the terminals 29 or 71 is desired. The larger output is accomplished by increasing the ohmic value of the resistors in the collector circuits of $T_1$ and $T_3$. In FIGURE 2 these resistors are identified by numerals 77 and 79. Also, the voltage applied to these resistors, and consequently to the collectors 19 and 63, is increased in a negative direction.

It will be noted that the components and voltages of the flip-flop have been chosen so that saturation of any of the transistors is avoided. The result of non-saturation operations is to diminish hole storage and thus improve the switching time. As is known, faster switching times are achieved during non-saturated operation than during the condition where the transistor is saturated. Also, much higher trigger power is required to switch a saturated transistor than a non-saturated one. Further, the invention utilizes a circuit wherein high output current and low output impedance are obtained. These advantages enable the circuit to drive gates and/or other flip-flops through long distances with minimum stray capacitance effects. The arrangement allows the outputs of the flip-flop to be loaded as much as desired without affecting the switching operation of the circuit. This is achieved by isolating the output from the internal flip-flop.

Great flexibility has been achieved by providing a circuit wherein a small input signal will permit a large output voltage. This is achieved by coupling the circuit so that $T_1$ and $T_3$ have their own voltage sources and resistors. As shown in FIGURE 2, the resistors in the collector circuits of $T_1$ and $T_3$ may be adjusted along with the potential applied thereto, to achieve the desired voltage swing on the output terminals. The only requirements are that $T_1$ and $T_3$ be prevented from reaching a condition of saturation and that the transistor ratings not be exceeded.

Another important feature of the invention is that the flip-flop is insensitive to trigger amplitude beyond a certain minimum voltage. This is achieved by causing the input voltage pulse to turn the "on" transistor "off" rather than vice versa.

In a model of the flip-flop that was constructed and operated, the value and identity of the components were as follows:

Resistors 15 and 61—500 ohms
Resistors 23, 25, 67 and 69—200 ohms
Resistors 37 and 49—100 ohms
Inductors 39 and 51—47 micro-henries
Resistors 77 and 79—820 ohms
$T_1$, $T_2$, $T_3$ and $T_4$—CK761
$T_5$ and $T_6$—2N94A The output of the circuit constructed according to the circuit of FIGURE 1 was approximately 2.8 volts; the output of the circuit of FIGURE 2 was approximately 11.0 volts.

A related patent of the same inventor and assigned to a common assignee is identified as Patent No. 2,928,011, granted March 8, 1960.

I claim:

1. A bistable transistor circuit comprising a pair of flip-flop transistors, each of said transistors having an emitter, a base and a collector, an auxiliary transistor in parallel with each of said flip-flop transistors, each of said auxiliary transistors having an emitter, a collector, and a base, a source of first potential coupled to the emitters of all of said transistors, a source of second potential coupled to the collectors of all of said transistors, a third source of potential coupled to the bases of said auxiliary transistors, switching means coupled between the bases and collectors of said flip-flop transistors and adapted to receive pulses, and inductive means coupled to said switching means and to said flip-flop transistors, whereby upon activation from said switching means said inductive means react to turn off the conducting flip-flop transistor, to change the bistable transistor circuit from one bistable state to its other bistable state and thereby produce an output signal at the respective auxiliary transistor.

2. The combination as defined in claim 1 wherein said switching means comprises a pair of interconnected transistors of the opposite conductivity type from said flip-flop transistors and said auxiliary transistors.

3. A bistable circuit comprising a first flip-flop transistor and a second flip-flop transistor, each of said transistors having a base, an emitter, and a collector, a source of potential coupled to said emitters of said transistors, a first and a second cross-over transistor, each of said cross-over transistors having a base, an emitter, and a collector, said cross-over transistors being of a conductivity type opposite that of said flip-flop transistors, means coupling said collector of said first flip-flop transistor and said emitter of said first cross-over transistor to a source of potential, means coupling said collector of said second flip-flop transistor and said emitter of said second cross-over transistor to a source of potential, means coupling each of said collectors of said cross-over transistors to a source of reference potential through an inductance, and means coupling the base of said first flip-flop transistor to said collector of said second cross-over transistor, means coupling said base of said second flip-flop transistor to said collector of said first cross-over transistor, means coupling the base of said cross-over transistors to an input terminal for receiving pulses to change the state of said bistable circuit, and output means coupled to each of said flip-flop transistors for producing an output when its respective flip-flop transistor conducts.

4. A bistable circuit comprising a first and a second flip-flop transistor, each of said transistors having a base, an emitter, and a collector, a first and a second cross-over transistor, each of said transistors having a base, an emitter, and a collector, means coupling said collector of said first flip-flop transistor and said emitter of said first cross-over transistor to a source of potential, means coupling said collector of said second flip-flop transistor and said emitter of said second cross-over transistor to a source of potential, means coupling said base of said first flip-flop transistor and said collector of said second cross-over transistor to a source of reference potential through a first inductor, means coupling the base of said second flip-flop transistor and said collector of said first cross-over transistor to a source of reference potential through a second inductor, means coupling said bases of said cross-over transistors to a source of reference potential, a first transistor coupled in parallel relationship to said first flip-flop transistor and a second transistor coupled in parallel relationship with said second flip-flop transistor, means coupling said emitter of said first transistor and said emitter of said first flip-flop transistor to a source of potential, means coupling said emitter of said second transistor and said emitter of said second flip-flop transistor to a source of potential, input terminals coupled to the bases of each of said first and second transistors, means coupling said collector of said first transistor to an output terminal and a source of potential, and means coupling said collector of said second transistor to an output terminal and a source of potential.

5. The combination as defined in claim 4, including current limiting means in the collector circuit of said flip-flop transistors.

6. The combination as defined in claim 1 wherein said second source of potential is coupled only to said collectors of said flip-flop transistors and a fourth source of potential of greater absolute value than said second source of potential is coupled to the collectors of said auxiliary transistors.

7. A bistable circuit comprising a pair of flip-flop transistors, each with two main current carrying electrodes and a control electrode, a pair of auxiliary transistors each with two main current carrying electrodes and a control electrode, a corresponding one of each of said main current carrying electrodes and each control electrode thereof having individual terminals connected thereto, first potential means connected to the one of said main current carrying electrodes of said auxiliary transistors having a terminal connected thereto and to the corresponding one of said main current carrying electrodes of an individual one of said auxiliary transistors associated therewith, second potential means connected to the other of the main current carrying electrodes of said auxiliary transistors and to the corresponding one of the main current carrying electrodes of said associated one of said flip-flop transistors, a pair of cross-over transistors each with two main current carrying electrodes and a control electrode, said cross-over transistors being cross-coupled to said flip-flop transistors wherein one of said main current carrying electrodes of each of said cross-over transistors is connected to the non-corresponding one of the main current carrying electrodes of the flip-flop transistors and the other main current carrying electrode of said cross-over transistors is coupled to the control electrode of the flip-flop transistors, parallel inductive resistive networks connected between said other main current carrying electrodes of said cross-over transistors and a source of reference potential, and a common terminal connected to the control electrodes of said cross-over transistors.

8. The combination as defined in claim 7, wherein the potential connected to the one of said main current carrying electrodes of said auxiliary transistors having a terminal connected thereto is of greater absolute value than the potential connected to the corresponding one of the main current carrying electrodes of said flip-flop transistors.

References Cited in the file of this patent

UNITED STATES PATENTS

| | | |
|---|---|---|
| 2,885,574 | Roesch | May 5, 1959 |
| 2,909,680 | Moore et al. | Oct. 20, 1959 |
| 2,928,011 | Campbell | Mar. 8, 1960 |
| 2,933,621 | Poppelbaum | Apr. 19, 1960 |